United States Patent [19]
Neu

[11] 3,743,890
[45] July 3, 1973

[54] DIODE MATRIX CARD ASSEMBLY WITH CONDUCTIVE ELASTOMERIC MATERIAL CONNECTORS

[75] Inventor: John P. Neu, Berkeley, Ill.

[73] Assignee: GTE Automatic Electric Laboratories Incorporated, Northlake, Ill.

[22] Filed: Jan. 3, 1972

[21] Appl. No.: 215,001

[52] U.S. Cl. .......... 317/101 CP, 340/166 R, 317/99, 317/101 CE
[51] Int. Cl. .......... H05k 7/12
[58] Field of Search .......... 317/99, 101 CE, 100, 317/120, 101 CP; 339/18 C; 340/166 R, 166 EL

[56] References Cited

UNITED STATES PATENTS

| | | | |
|---|---|---|---|
| 3,670,205 | 6/1972 | Dixon | 317/101 CE |
| 3,191,100 | 6/1965 | Sorvillo | 339/18 C |
| 2,019,625 | 11/1935 | O'Brien | 317/101 CE |
| 3,149,266 | 9/1964 | Lipton | 317/101 CM |
| 3,149,265 | 9/1964 | Thorn | 317/100 |

*Primary Examiner*—Herman J. Hohauser
*Assistant Examiner*—Gerald P. Tolin
*Attorney*—K. Mullerheim et al.

[57] ABSTRACT

A diode matrix card assembly including a pair of printed wiring cards, an array of conductive elastomeric material strips on each of the wiring cards, and a number of diodes intermediate the cards and positioned normal thereto, with each of the diode leads insertably engaging the respective conductive elastomeric strip on each side of the diode during assembly for mechanically mounting and electrically connecting the diodes in the assembly. The conductive elstomeric material strips are mounted in a crossing grid array so that they also serve as selection conductors in the assembly.

8 Claims, 3 Drawing Figures

FIG. 1
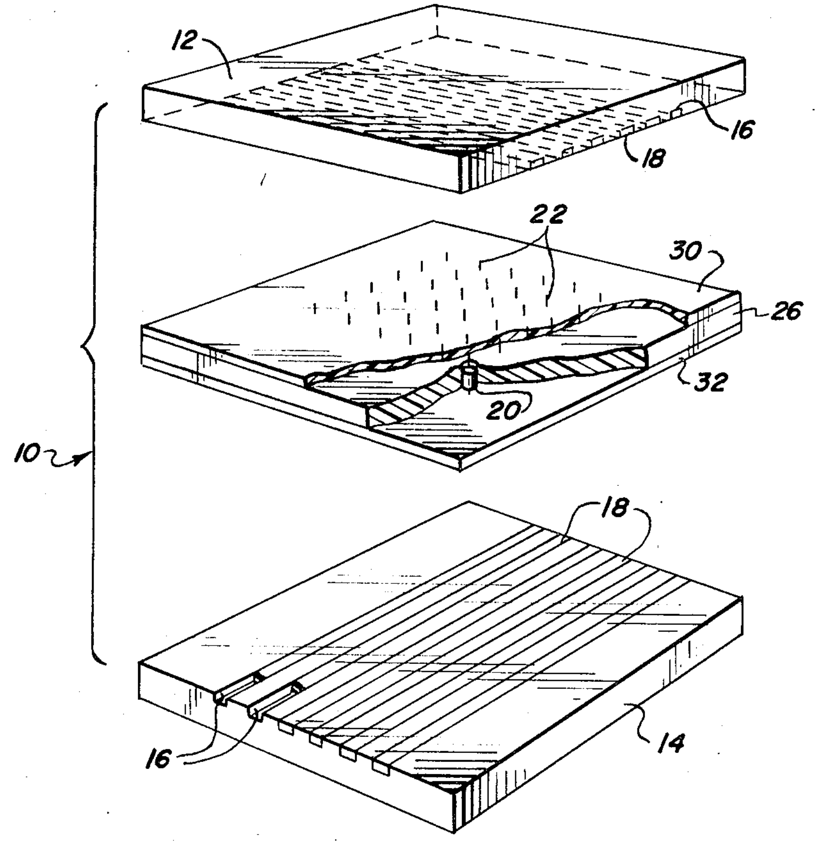
FIG. 2
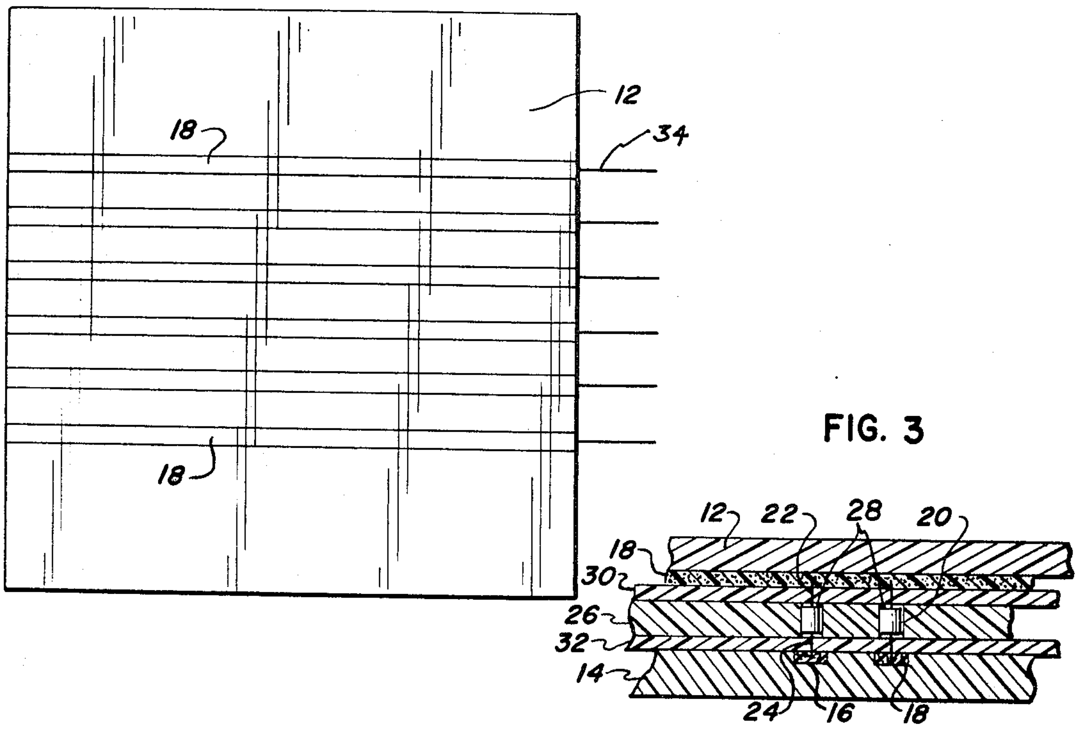
FIG. 2, FIG. 3

DIODE MATRIX CARD ASSEMBLY WITH CONDUCTIVE ELASTOMERIC MATERIAL CONNECTORS

This invention relates to printed wiring board assemblies and more particularly to the use of conductive elastomeric material as a connector and as an array of electrical conductors in a diode matrix card assembly.

Presently, one of the techniques used for providing electrical paths in printed wiring or circuit assemblies or packages, consists of mounting cordless program boards on matrix printed wiring cards. The number of cordless program boards mounted on each printed wiring card determines the complexity and size of the program that may be achieved, with the electrical paths being established or interrupted for programming and switching by suitable selection thereof. Utilizing this technique, programming of the various electrical paths is accomplished by inserting diode pins and shorting pins into the program boards.

One disadvantage which has arisen with this assembly technique is that the profile height of the printed wiring cards often requires that additional card files be used to accommodate all of the components required, thereby increasing the physical size of the system and further increasing the cost involved. In addition, due to the variety of components required using this technique, such as the cordless programming board, diode pins, and shorting pins, such an assembly becomes very expensive particularly when utilized in large electronic network systems.

SUMMARY OF THE INVENTION

Therefore, in accordance with the principles of the present invention, there is provided a matrix card sandwich assembly in which two conductor arrays formed of strips of conductive elastomeric material are mounted on respective printed wiring cards for compressing, connecting engagement with the leads of electrical components, such as diodes located intermediate of the conductor arrays. In assembly, the printed wiring cards with the arrays of elastomeric conductive material facing each other are brought together so that with the diodes normal thereto, the diode leads are pressed into the material. This technique not only forms a means for both electrically connecting and mechanically mounting the diodes in the assembly, but also enables the conductive elastomeric material strips to be used as the conductor matrix array of selection conductors so that suitable electrical paths for programming and switching can be accomplished by selecting one or more of the conductive elastomeric conductor strips in each array.

BRIEF DESCRIPTION OF THE DRAWINGS

FIG. 1 is an exploded view of a diode matrix card assembly illustrating the individual components thereof in accordance with the principles of the present invention;

FIG. 2 is a plan view of one of the printed wiring cards containing strips of conductive elastomeric material mounted thereon; and FIG. 3 is a partial, fragmented sectional view of the assembled diode matrix card assembly.

DETAILED DESCRIPTION

Referring now to FIG. 1, there is illustrated an exploded view of a diode matrix card assembly 10 constructed in accordance with and illustrating the principles of the present invention. In particular, a pair of printed wiring cards 12 and 14 each contain a series of slots, such as slots 16 (see FIG. 3) for accommodating corresponding strips of conductive elastomeric material 18 suitably mounted therein. The strips 18 can be formed of elastomeric material, such as silicon rubber impregnated with conductive particles such as silver plated copper powder. Such types of conductive elastomeric material are shown for instance in U.S. Pat. Nos. 3,140,342; 3,194,860 and 3,292,488, and are commercially available.

Any suitable means can be utilized for bonding the material 18 to the cards 12 and 14. For instance, strips of the conductive elastomeric material 18 can be formed sized to the slots 16 and bonded thereto. Alternatively, the material 18 may be molded directly into the cards 12 and 14.

Intermediate the printed wiring cards 12 and 14 in the assembly 10, there is provided a series of diodes 20 each having respective diode leads 22 and 24 extending therefrom for engagement with the material strips 18. As shown in FIGS. 1 and 3, the diodes 20 are mounted normal to the cards 12 and 14 by means of a diode holding card 26.

The diode holding card 26 contains a plurality of apertures 28 each of which is sized so as to accommodate the body portion of a diode 20. In the illustrated 6 × 6 matrix embodiment illustrated herein, the diode holder card will contain 36 of the apertures 28 to accommodate a corresponding number of diodes. It is to be understood that this is only for purposes of illustrating the present invention, since the principles herein can as well be applied to larger or smaller matrices.

A pair of diode lead guide members 30, 32 are provided on each end of the holder card 26 for lending some guidable support during assembly to the diode leads 22 and 24 respectively protruding through a corresponding number of apertures provided therein. Instead of the separate cards 30, 32, other means such as small ridges on the diode holding card at each of the apertures 28 can be provided to perform the function of supporting and guiding the diode leads.

In any event, as can be seen from the details of FIG. 3, the diode holder card 26 and the members 30, 32 are sized with respect to the length of the diode leads 22, 24 such that the respective ends of the leads extend through the corresponding apertures and project slightly therebeyond. Thus, during assembly of the various illustrated components, as the printed wiring cards 12 and 14 are moved towards the diodes, the ends of the diode leads 22, 24 depress into and connectively engage the conductive elastomeric material 18 so as to form an electrical and mechanical connection therewith. Since the array of conductive material strips 18 on printed wiring card 12 is disposed orthogonally in a crossing grid manner to the corresponding array on card 14 as shown in the exploded view of FIG. 1 and the assembled view of FIG. 3, any one of the diodes 20 in the 6 × 6 matrix can be selected by coupling suitable signals between line 34 which is coupled to one of the strips on for instance card 12 and a corresponding line coupled to another conductive strip on card 14. The conductive elastomeric strips thereby also serve as the selection conductors.

Thus, in the present invention, the diode matrix card assembly incorporates the conductive elastomeric material strips not only as electrical connectors and a mechanical supporting mount for components such as the illustrated diodes, but also as a selection conductor array useful in matrix selection.

The foregoing detailed description has been given for clearness of understanding only, and no unnecessary limitations should be understood therefrom, as modifications will be obvious to those skilled in the art.

What is claimed is:

1. A diode matrix card assembly comprising:
 - a plurality of diodes each having a body portion and conductive leads extending from either end of said body portion;
 - a diode holding plate having a plurality of apertures therethrough, said diodes being removably positioned within respective apertures with said body portion substantially within said diode holding plate and said leads extending through said apertures and projecting from respective opposite sides of said plate;
 - a pair of outer card members each having a surface facing respective opposite sides of said diode holding plate; and
 - respective conductor arrays formed of conductive elastomeric material mounted on each of said surfaces on said outer members,
 - said outer card members positioned immediately adjacent said respective opposite sides of said diode holding plate and said diode conductive leads inserted into said conductive elastomeric material for electrical connection thereto.

2. A diode matrix card assembly as claimed in claim 1, wherein said respective conductor arrays each comprises a plurality of conductive elastomeric strips formed of said conductive elastomeric material mounted to said surfaces of said outer card members.

3. A diode matrix card assembly as claimed in claim 2, including means for mounting said conductive elastomeric strips in an opposing, crossing grid array on said outer card members.

4. A diode matrix card assembly as claimed in claim 3, including means for mounting said conductive elastomeric strips on one of said outer card members orthogonally with respect to the array of conductive elastomeric strips on the other of said outer card members.

5. A diode matrix card assembly as claimed in claim 1, including a pair of thin, non-conductive card members each having a plurality of apertures therethrough, each of said thin, non-conductive card members disposable on said respective opposite sides of said diode holding plate intermediate said respective conductor arrays, guidably supporting said diode conductive leads protruding through said apertures during conductive engagement thereof with said respective conductor arrays.

6. A diode matrix card assembly as claimed in claim 1, wherein said outer card members each includes a plurality of slots therein extending along said surface of said outer card member facing said diode holding plate, and means mounting said respective conductor arrays of conductive elastomeric material in said slots.

7. A diode mounting assembly comprising:
 - a pair of substantially parallel, non-conductive mounting surfaces;
 - a first array of conductive elastomeric strips,
 - a second array of conductive elastomeric strips,
 - means mounting said first and second arrays of conductive elastomeric strips on said surfaces in an opposed, facing relationship; and
 - a plurality of diodes intermediate said first and second arrays, each of said diodes having respective diode conductive lead ends;
 - said respective diode conductive lead ends inserted into said corresponding array of conductive elastomeric strips to form an electrical and mechanical connection thereto, thereby enabling selection of any one of said plurality of diodes by selection of the corresponding conductive elastomeric strip in said respective arrays.

8. A diode mounting assembly as claimed in claim 7, including means mounting said first and second arrays of conductive elastomeric strips orthogonally to each other on said mounting surfaces.

* * * * *